United States Patent
Duriez et al.

(10) Patent No.: US 11,004,958 B2
(45) Date of Patent: May 11, 2021

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Blandine Duriez, Brussels (BE); Georgios Vellianitis, Heverlee (BE); Gerben Doornbos, Kessel-Lo (BE); Marcus Johannes Henricus Van Dal, Linden (BE); Martin Christopher Holland, Bertem (BE); Timothy Vasen, Tervuren (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/271,964

(22) Filed: Feb. 11, 2019

(65) Prior Publication Data
US 2020/0135897 A1    Apr. 30, 2020

Related U.S. Application Data

(60) Provisional application No. 62/753,893, filed on Oct. 31, 2018.

(51) Int. Cl.
*H01L 29/66* (2006.01)
*H01L 29/786* (2006.01)
(Continued)

(52) U.S. Cl.
CPC .. *H01L 29/66772* (2013.01); *H01L 21/30625* (2013.01); *H01L 21/31053* (2013.01);
(Continued)

(58) Field of Classification Search
CPC ......... H01L 29/66545; H01L 21/30625; H01L 29/66795; H01L 29/66553;
(Continued)

(56) References Cited

U.S. PATENT DOCUMENTS 6,548,875 B2 * 4/2003 Nishiyama ........ H01L 21/28562
257/288
7,569,456 B2   8/2009 Ko et al.
(Continued)

FOREIGN PATENT DOCUMENTS

JP     2001326351 A   11/2001
KR    20040077289 A    9/2004
(Continued)

OTHER PUBLICATIONS

Notice of Allowance issued in corresponding Korean Application No. 10-2019-0057336, dated Feb. 5, 2021.

*Primary Examiner* — Julia Slutsker
(74) *Attorney, Agent, or Firm* — McDermott Will & Emery LLP

(57) ABSTRACT

In a method of manufacturing a semiconductor device, a dummy gate structure is formed over a channel region of a semiconductor layer, a source/drain epitaxial layer is formed on opposing sides of the dummy gate structure, a planarization operation is performed on the source/drain epitaxial layer, the planarized source/drain epitaxial layer is patterned, the dummy gate structure is removed to form a gate space, and a metal gate structure is formed in the gate space.

20 Claims, 17 Drawing Sheets

(51) Int. Cl.
*H01L 29/08* (2006.01)
*H01L 21/306* (2006.01)
*H01L 21/3105* (2006.01)
*H01L 21/8234* (2006.01)
*H01L 21/8238* (2006.01)
*H01L 29/417* (2006.01)

(52) U.S. Cl.
CPC ............ *H01L 21/823418* (2013.01); *H01L 21/823814* (2013.01); *H01L 29/0847* (2013.01); *H01L 29/41783* (2013.01); *H01L 29/6656* (2013.01); *H01L 29/66545* (2013.01); *H01L 29/78603* (2013.01)

(58) Field of Classification Search
CPC ..... H01L 21/823418; H01L 21/823814; H01L 29/41783
See application file for complete search history.

(56) References Cited

U.S. PATENT DOCUMENTS

| | | |
|---|---|---|
| 9,397,003 B1 * | 7/2016 | Niimi ............. H01L 21/823418 |
| 9,443,853 B1 | 9/2016 | Cheng et al. |
| 9,466,697 B2 | 10/2016 | Park et al. |
| 2002/0008261 A1 | 1/2002 | Nishiyama |
| 2006/0148182 A1 | 7/2006 | Datta et al. |
| 2012/0112290 A1 | 5/2012 | Utomo et al. |
| 2012/0313144 A1 | 12/2012 | Zhang et al. |
| 2014/0154846 A1 * | 6/2014 | Cheng ............... H01L 29/66742 438/151 |
| 2015/0214351 A1 * | 7/2015 | Basker ................. H01L 29/517 257/19 |
| 2017/0012120 A1 | 1/2017 | Basker et al. |
| 2017/0110466 A1 | 4/2017 | Chuang et al. |
| 2019/0096759 A1 * | 3/2019 | Chang ................ H01L 29/7848 |

FOREIGN PATENT DOCUMENTS

| | | |
|---|---|---|
| KR | 20070088817 A | 8/2007 |
| KR | 20120047032 A | 5/2012 |
| KR | 2017/0046080 A | 4/2017 |

* cited by examiner

METHOD OF MANUFACTURING A SEMICONDUCTOR DEVICE AND A SEMICONDUCTOR DEVICE

RELATED APPLICATIONS

This application claim priority of U.S. Provisional Patent Application No. 62/753,893 filed on Oct. 31, 2018, of which disclosure is incorporated herein by reference.

BACKGROUND

Conventional complementary metal-oxide-semiconductor (CMOS) technology is often implemented to fabricate a large number of semiconductor devices, such as metal-oxide-semiconductor field effect transistors (MOSFETs) and bipolar junction transistors (BJTs), at approximately a same level on a single integrated-circuit (IC) chip. In advanced IC chips, transistors are disposed on multiple layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
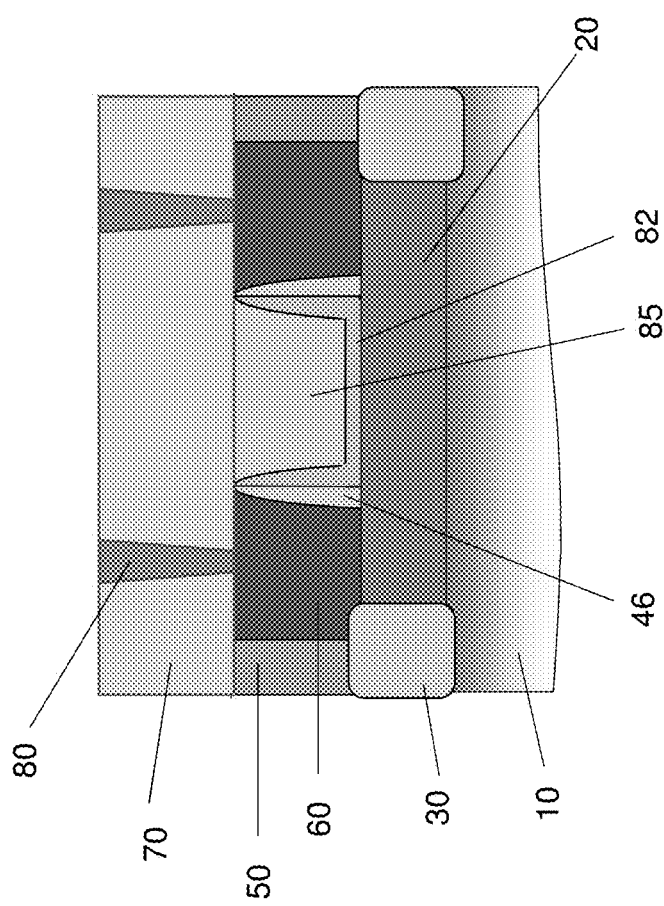
FIG. 1 shows a cross sectional view of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

For a transistor fabrication process in the back-end of line, there is a need to selectively form a source/drain epitaxial layer. However, the selective source/drain epitaxial growth method may not be suitable for a back-end-of-line process because there is a limitation in the thermal budget, for example, less than 450° C. Introducing dopants into the source/drain epitaxial layer at high levels often causes selective epitaxial growth to become non-selective. HCl gas can help to restore selectivity but can reduce doping efficiency and growth rate. For nm-scale structures, especially where Ge or SiGe is used, a low thermal budget is required. However, selective epitaxial growth at a low temperatures (<500° C.) for Si:P is generally challenging. Although selective epitaxial growth at a low temperatures (<500° C.) for Ge:P is possible, Ge:P is only selective to a high density oxide. For nitride or PVD oxide, selectivity is again a problem. In addition, replacement gate (RPG) technology generally needs a contact opening mask to contact the source and drain (S/D) after the replacement gate process.

The present disclosure provides a novel replacement gate (RPG) technology with one (1) less mask (no contact opening mask needed) and a non-selective source/drain (S/D) epitaxial process.

In the following embodiments, material, configurations, dimensions and/or processes of one embodiment may be employed in another embodiment, unless otherwise described, and detailed explanation thereof may be omitted.

FIG. 1 shows a cross sectional view of a semiconductor FET device according to an embodiment of the present disclosure. In some embodiments, a semiconductor device includes a semiconductor layer 20 having a channel region, a source region and a drain region formed over or as a part of a semiconductor layer 10, a gate dielectric layer 82, such as a high-k dielectric material, disposed over the channel region of the semiconductor layer 20, a metal gate electrode layer 85 disposed over the gate dielectric layer 82, first gate sidewall spacers 46 disposed on opposite side faces of the gate electrode layer 85, and a source/drain epitaxial layer 60 disposed over the source and drain regions of the semiconductor layer 20. In some embodiments, the semiconductor layer 20 is a crystalline semiconductor, such as Si, SiGe, Ge or Group III-V semiconductor.

In some embodiments, a height difference between an upper most portion of the epitaxial layer 60 and an uppermost portion of the gate electrode layer 85 is less than 5 nm (±5 nm). In other embodiments, the height difference is less than 2 nm. In certain embodiments, the height difference is zero (flush with each other).

In some embodiments, the source/drain epitaxial layer 60 is disposed laterally beyond the source and drain regions of the semiconductor layer 20 and is disposed on a dielectric layer 30. In some embodiments, the dielectric layer 30 is an isolation insulating layer, such as shallow trench isolation (STI). In some embodiments, the source/drain epitaxial layer 60 includes one or more of SiP and SiCP. In other embodiments, the source/drain epitaxial layer 60 includes one or more of SiGe and Ge. In some embodiments, a height difference between an upper most portion of the first gate sidewall spacers 46 and the uppermost portion of the source/drain epitaxial layer 60 or the uppermost portion of the gate electrode layer 85 is less than 5 nm. In some embodiments, a height difference between an upper most portion of the second gate sidewall spacers 48 and the uppermost portion of the source/drain epitaxial layer 60 or the uppermost portion of the gate electrode layer 85 is less than 5 nm. Further, as shown in FIG. 1, a first interlayer dielectric (ILD) layer 50 is disposed on sides of the gate structure and a second ILD layer 70 is disposed over the first ILD layer 50. A source/drain contact 80 is disposed over the source/drain epitaxial layer 60 passing through the second ILD layer 70.

Figure 2:
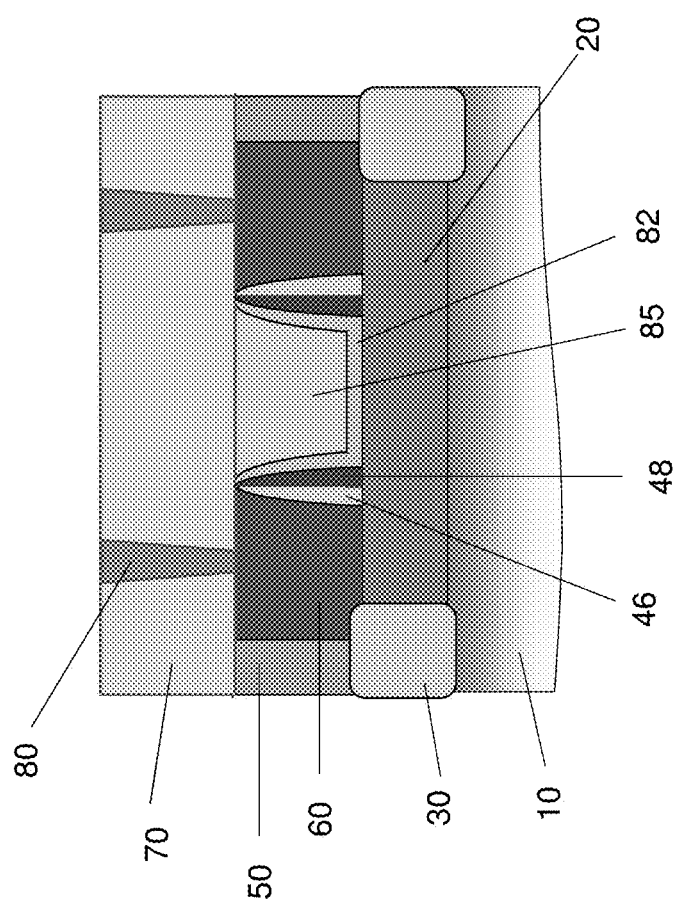
FIG. 2 shows a cross sectional view of a semiconductor FET device according to another embodiment of the present disclosure.

FIG. 2 shows a cross sectional view of a semiconductor FET device according to another embodiment of the present disclosure.

In some embodiments, a semiconductor device includes a semiconductor layer 20 having a channel region, a source region and a drain region formed over or as a part of a semiconductor layer 10, a gate dielectric layer 82, such as a high-k dielectric material, disposed over the channel region of the semiconductor layer 20, a metal gate electrode layer 85 disposed over the gate dielectric layer 82, first gate sidewall spacers 46 disposed on opposite side faces of the gate electrode layer 85, second gate sidewall spacers 48 disposed between the first sidewall spacers 46 and the gate electrode layer 85, and a source/drain epitaxial layer 60 disposed over the source and drain regions of the semiconductor layer 20. In some embodiments, the semiconductor layer 20 is a crystalline semiconductor, such as Si, SiGe, Ge or Group III-V semiconductor.

In some embodiments, a height difference between an upper most portion of the epitaxial layer 60 and an uppermost portion of the gate electrode layer 85 is less than 5 nm (±5 nm). In other embodiments, the height difference is less than 2 nm. In certain embodiments, the height difference is zero (flush with each other). In some embodiments, a ratio H1/H2 of a height H1 of the upper most portion of the epitaxial layer 60 to a height H2 of the uppermost portion of the gate electrode layer 85 measured from the upper surface of the semiconductor layer 20 or 22 is in a range from about 0.90 to 1.10, and is in a range from about 0.95 to 1.05 in other embodiments.

In some embodiments, the source/drain epitaxial layer 60 is disposed laterally beyond the source and drain regions of the semiconductor layer 20 and is disposed on a dielectric layer 30. In some embodiments, the dielectric layer 30 is an isolation insulating layer, such as shallow trench isolation (STI). In some embodiments, the source/drain epitaxial layer 60 includes one or more of SiP and SiCP. In other embodiments, the source/drain epitaxial layer 60 includes one or more of SiGe and Ge. In some embodiments, a height difference between an upper most portion of the first gate sidewall spacers 46 and the uppermost portion of the source/drain epitaxial layer 60 or the uppermost portion of the gate electrode layer 85 is less than 5 nm. In some embodiments, a height difference between an upper most portion of the second gate sidewall spacers 48 and the uppermost portion of the source/drain epitaxial layer 60 or the uppermost portion of the gate electrode layer 85 is less than 5 nm. Further, as shown in FIG. 1, a first interlayer dielectric (ILD) layer 50 is disposed on sides of the gate structure and a second ILD layer 70 is disposed over the first ILD layer 50. A source/drain contact 80 is disposed over the source/drain epitaxial layer 60 passing through the second ILD layer 70.

In this embodiment, the gate sidewall spacers includes the first gate sidewall spacers 46 and second gate sidewall spacers 48 disposed closer to the gate electrode 85 than the first gate sidewall spacers. A curved surface of the first gate sidewall spacer 46 faces the source/drain epitaxial layer 60 and a curved surface of the second gate sidewall spacer 48 faces the gate electrode layer 85. In some embodiments, the curved surface of the second sidewall spacer 48 is in contact with the gate dielectric layer 82.

In some embodiments, a piece of a dummy gate dielectric layer (not shown in FIGS. 1-3) is disposed between the first sidewall spacer 46 and the semiconductor layer 20. In some embodiments, no piece of the dummy gate dielectric layer is disposed between the second sidewall spacer 48 and the semiconductor layer 20.

Figure 3:
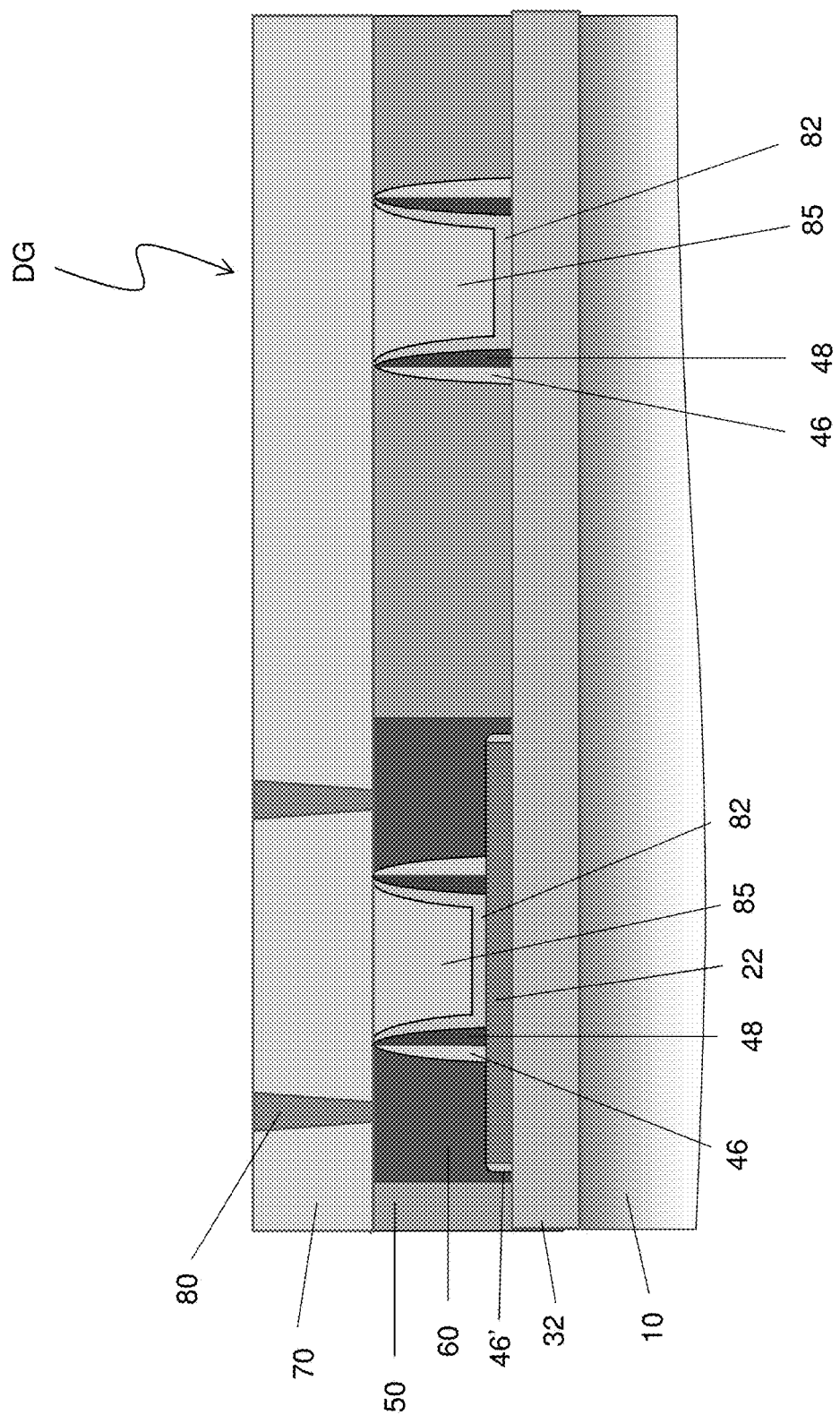
FIG. 3 shows a cross sectional view of a semiconductor FET device according to another embodiment of the present disclosure.

FIG. 3 shows a cross sectional view of a semiconductor FET device according to another embodiment of the present disclosure. In this embodiment, a semiconductor 22 layer for the channel region and source/drain regions are disposed on an insulating layer 32. In some embodiments, the insulating layer 32 is an insulating layer (e.g., a silicon oxide layer) of a silicon-on-insulator (SOI) wafer, and in other embodiments, the insulating layer 32 is an interlayer dielectric layer disposed over underlying devices, such as transistors. In some embodiments, the semiconductor layer 22 is a crystalline semiconductor, such as Si, SiGe, Ge or Group III-V semiconductor. In some embodiments, sidewalls 46' are formed on side faces of the semiconductor layer 22.

In some embodiments, a semiconductor device includes a semiconductor layer 22 having a channel region, a source region and a drain region formed over an insulating layer 35, a gate dielectric layer 82, such as a high-k dielectric material, disposed over the channel region of the semiconductor layer 20, a metal gate electrode layer 85 disposed over the gate dielectric layer 82, first gate sidewall spacers 46 disposed on opposite side faces of the gate electrode layer 85, second gate sidewall spacers 48 disposed between the first sidewall spacers 46 and the gate electrode layer 85, and a source/drain epitaxial layer 60 disposed over the source and drain regions of the semiconductor layer 22.

In some embodiments, a height difference between an upper most portion of the epitaxial layer 60 and an uppermost portion of the gate electrode layer 85 is less than 5 nm (±5 nm). In other embodiments, the height difference is less than 2 nm. In certain embodiments, the height difference is zero (flush with each other).

In some embodiments, the source/drain epitaxial layer 60 is disposed laterally beyond the source and drain regions of the semiconductor layer 22 and is disposed on the insulating layer 32. In some embodiments, the source/drain epitaxial layer 60 includes one or more of SiP and SiCP. In other embodiments, the source/drain epitaxial layer 60 includes one or more of SiGe and Ge. In some embodiments, a height difference between an upper most portion of the first gate sidewall spacers 46 and the uppermost portion of the source/drain epitaxial layer 60 or the uppermost portion of the gate electrode layer 85 is less than 5 nm. In some embodiments, a height difference between an upper most portion of the second gate sidewall spacers 48 and the uppermost portion of the source/drain epitaxial layer 60 or the uppermost portion of the gate electrode layer 85 is less than 5 nm. Further, as shown in FIG. 1, a first interlayer dielectric (ILD) layer 50 is disposed on sides of the gate structure and a second ILD layer 70 is disposed over the first ILD layer 50. A source/drain contact 80 is disposed over the source/drain epitaxial layer 60 passing through the second ILD layer 70.

In this embodiment, the gate sidewall spacers includes the first gate sidewall spacers 46 and second gate sidewall spacers 48 disposed closer to the gate electrode 85 than the first gate sidewall spacers. A curved surface of the first gate sidewall spacer 46 faces the source/drain epitaxial layer 60 and a curved surface of the second gate sidewall spacer 48 faces the gate electrode layer 85. In some embodiments, the curved surface of the second sidewall spacer 48 is in contact with the gate dielectric layer 82.

In some embodiments, a piece of a dummy gate dielectric layer (not shown in FIGS. 1-3) is disposed between the first sidewall spacer 46 and the semiconductor layer 22. In some embodiments, no piece of the dummy gate dielectric layer is disposed between the second sidewall spacer 48 and the semiconductor layer 22.

In some embodiments, the source/drain epitaxial layer 60 is disposed laterally beyond the source and drain regions of the semiconductor layer 22 and is disposed on the insulating layer 32.

Further, in some embodiments, one or more dummy gate structures DG are disposed over the substrate 10. In some embodiments, the dummy gate DG has substantially the same structure as the gate structure for a functional transistor, and is not disposed on a semiconductor layer and is disposed on the insulating layer 35. No source/drain epitaxial layer is disposed on the sides of the dummy gate structure DG.

In some embodiments, the height differences as mentioned above is not zero, and the source/drain epitaxial layer 60 is higher or lower than the other features by at least 0.5 nm.

FIGS. 4A-16B show various stages of manufacturing a semiconductor FET device according to an embodiment of the present disclosure. It is understood that additional operations can be provided before, during, and after the operations shown by FIGS. 4-16B, and some of the operations described below can be replaced or eliminated, for additional embodiments of the method. The order of the operations/processes may be interchangeable. Further, in the present disclosure, a source and a drain are interchangeably used and a source/drain refers to at least one of a source and a drain. In FIGS. 4A-16B, the "A" figures are perspective views, and the "B" figures are cross sectional views corresponding to line A-A' of FIG. 4A.

Figure 4B:
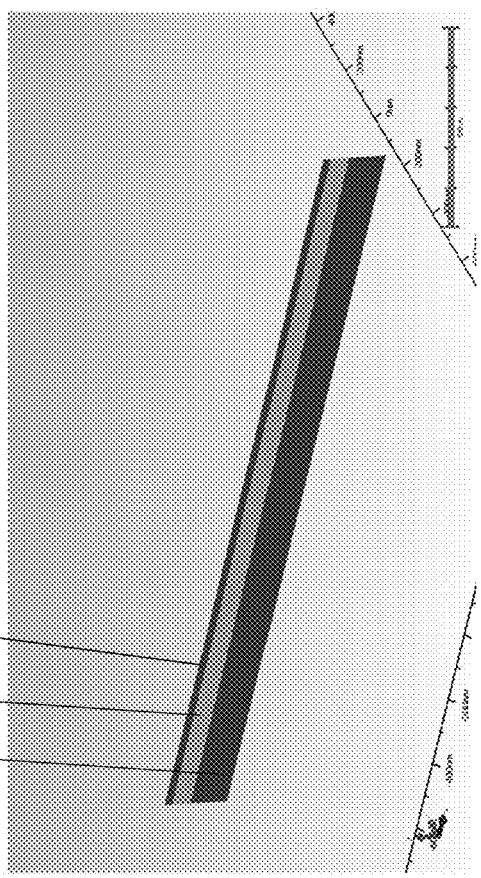
FIGS. 4A and 4B show one of the various stages of manufacturing a semiconductor FET device according to an embodiment of the present disclosure.
Figure 4A:
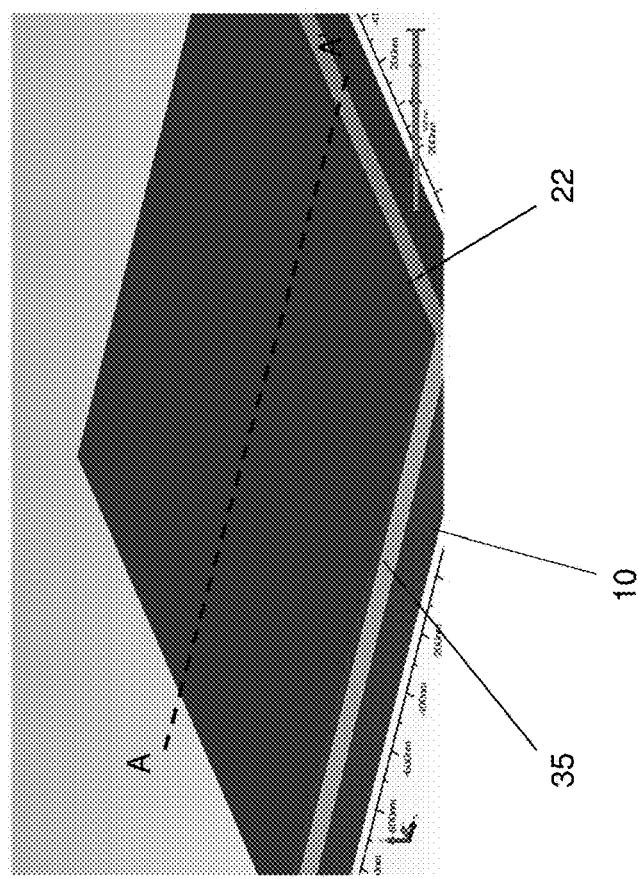

As shown in FIGS. 4A and 4B, a substrate 10 is provided. In some embodiments, the substrate 10 is a silicon-on-insulator (SOI) substrate. In other embodiments, the substrate 10 includes a single crystal semiconductor layer on at least its surface portion. The substrate 10 may comprise a single crystal semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si, SiGe or Ge. The substrate 10 may include in its surface region, one or more buffer layers (not shown) in some embodiments. The buffer layers can serve to gradually change the lattice constant from that of the substrate to that of the source/drain regions. The buffer layers may be formed from epitaxially grown single crystal semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 4A and 4B, an insulating layer 35 is disposed over the substrate 10 and a semiconductor layer 22 is disposed over the insulating layer 35. When an SOI substrate is used, the semiconductor layer 22 is the silicon layer and the insulating layer 35 is the insulator layer of the SOI substrate. In some embodiments, the semiconductor layer 22 is formed by re-crystallizing an amorphous semiconductor layer or a polycrystalline semiconductor layer formed on the insulating layer 35. In some embodiments, the semiconductor layer 22 is a crystalline semiconductor, such as Si, SiGe, Ge or Group III-V semiconductor. In some embodiments, the thickness of the semiconductor layer 22 is in a range from about 10 nm to about 10 μm.

Figure 5B:
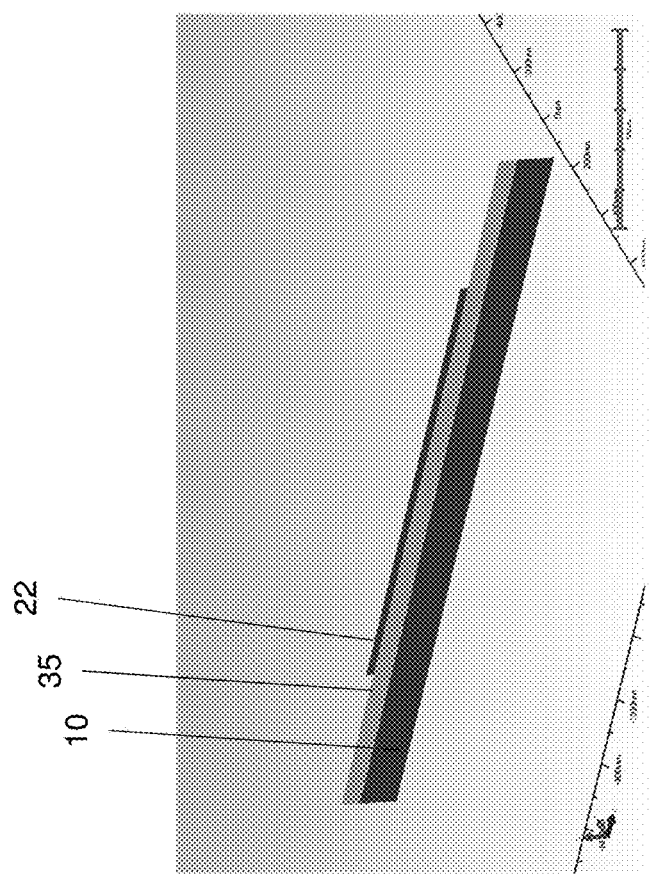
FIGS. 5A and 5B show one of the various stages of manufacturing a semiconductor FET device according to an embodiment of the present disclosure.
Figure 5A:
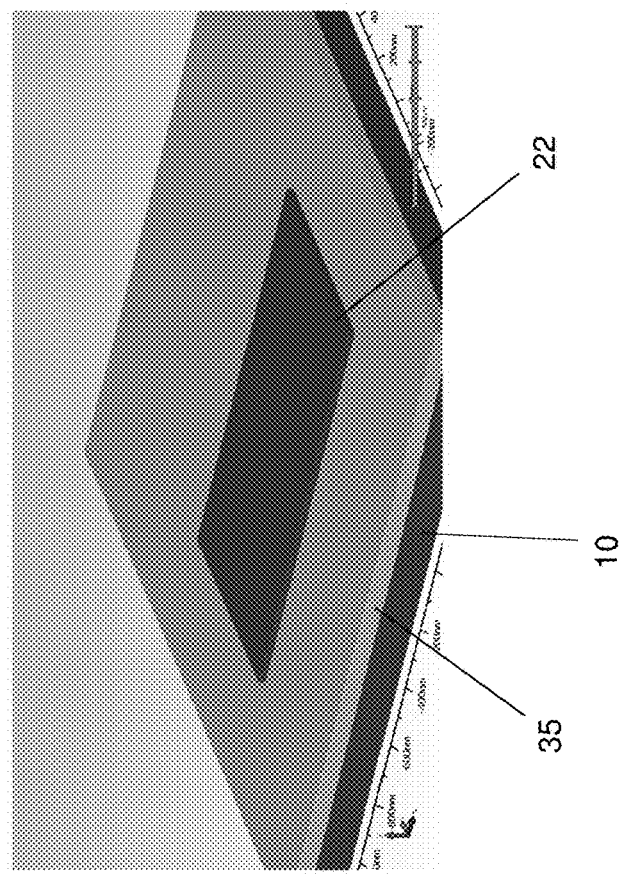

As shown in FIGS. 5A and 5B, the semiconductor layer 22 is patterned to form an active layer (channel and source/drain regions).

Figure 6B:
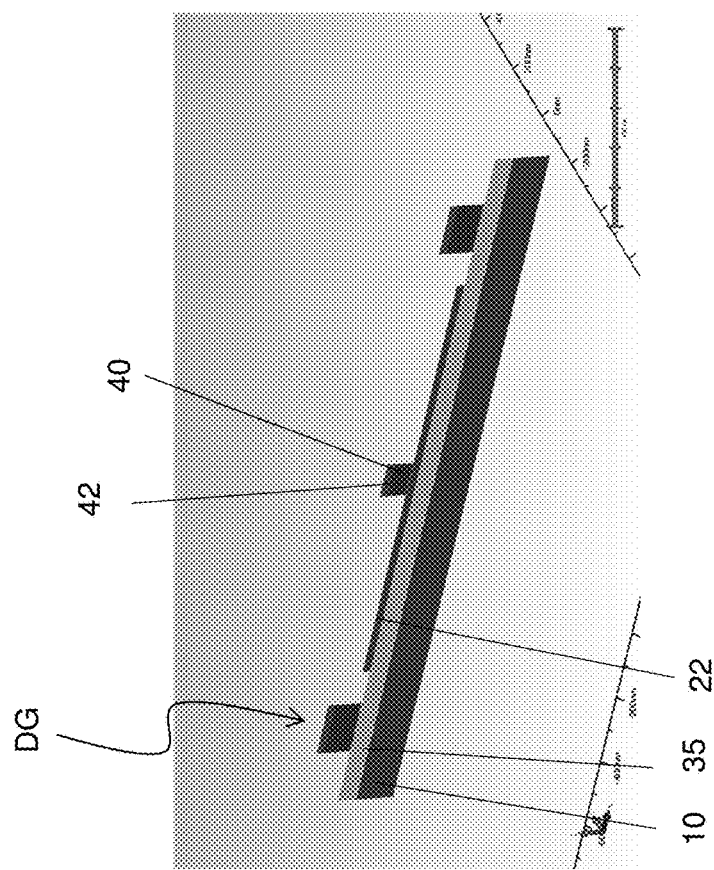
FIGS. 6A and 6B show one of the various stages of manufacturing a semiconductor FET device according to an embodiment of the present disclosure.
Figure 6A:
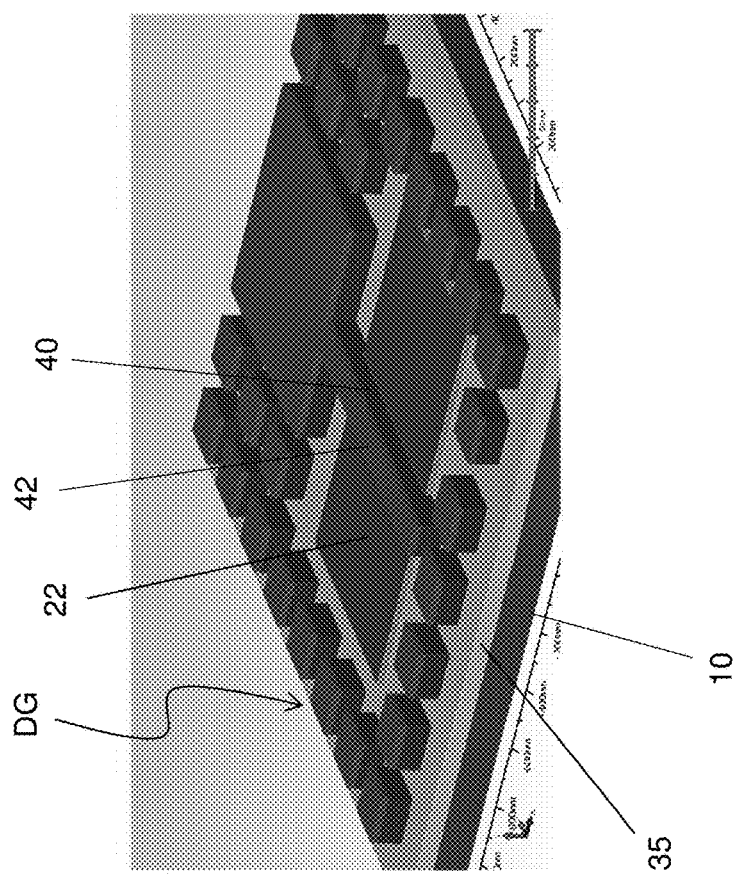

Then, dummy gate structures for a gate replacement technique are formed as shown in FIGS. 6A and 6B. In some embodiments, the dummy gate structure includes a dummy gate dielectric layer (not shown), such as silicon oxide, and a dummy gate electrode layer 40. In some embodiments, the dummy gate electrode layer 40 is polycrystalline or amorphous SiGe or Ge. In certain embodiments, the dummy gate electrode layer 40 is amorphous or polycrystalline Ge. The dummy gate electrode layer 40 is formed by chemical vapor deposition (CVD) or any other suitable film formation methods. In some embodiments, CVD is performed at a temperature equal to or less than 450° C. In some embodiments, the temperature is more than 200° C.

Further, a hard mask layer 42 is formed over the dummy gate electrode layer 40. In some embodiments, the hard mask layer 42 is made of a silicon nitride based material, such as silicon nitride, SiON or SiCN. After the hard mask layer 42 is formed, by using one or more lithography and etching operations, the hard mask layer 42 is patterned. Then, by using the patterned hard mask layer 42 as an etching mask, deposited dummy gate electrode layer 40 is patterned. In some embodiments, one or more dummy structures DG for suppressing process variations and/or to improve pattern fidelity are formed to surround the dummy gate structure for a functional transistor.

In some embodiments, the dummy gate electrode 40 for a functional transistor includes a gate portion disposed over the semiconductor layer 20 and a pad portion disposed over the insulating layer 35 for a gate contact. A distal end of the dummy gate electrode 40 is disposed on the insulating layer 35. The dummy structures DG are formed on a dielectric layer. In some embodiments, the thickness of the dummy gate electrode 40 is in a range from about 20 nm to about 500 nm, and is in a range from about 50 nm to about 200 nm in other embodiments. In some embodiments, the thickness of the hard mask layer 42 is in a range from about 20 nm to about 100 nm.

Figure 7B:
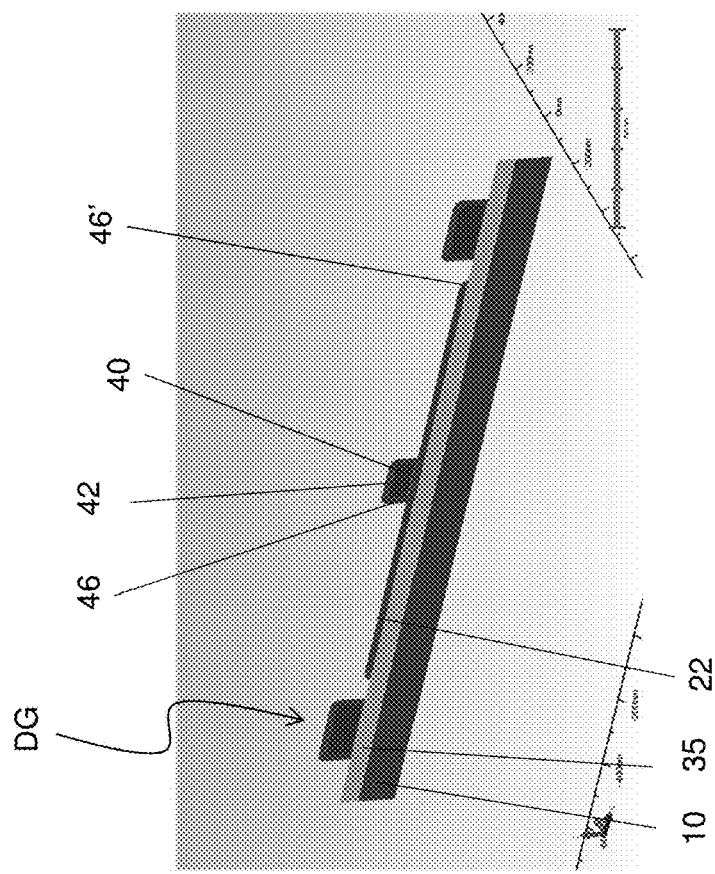
FIGS. 7A and 7B show one of the various stages of manufacturing a semiconductor FET device according to an embodiment of the present disclosure.
Figure 7A:
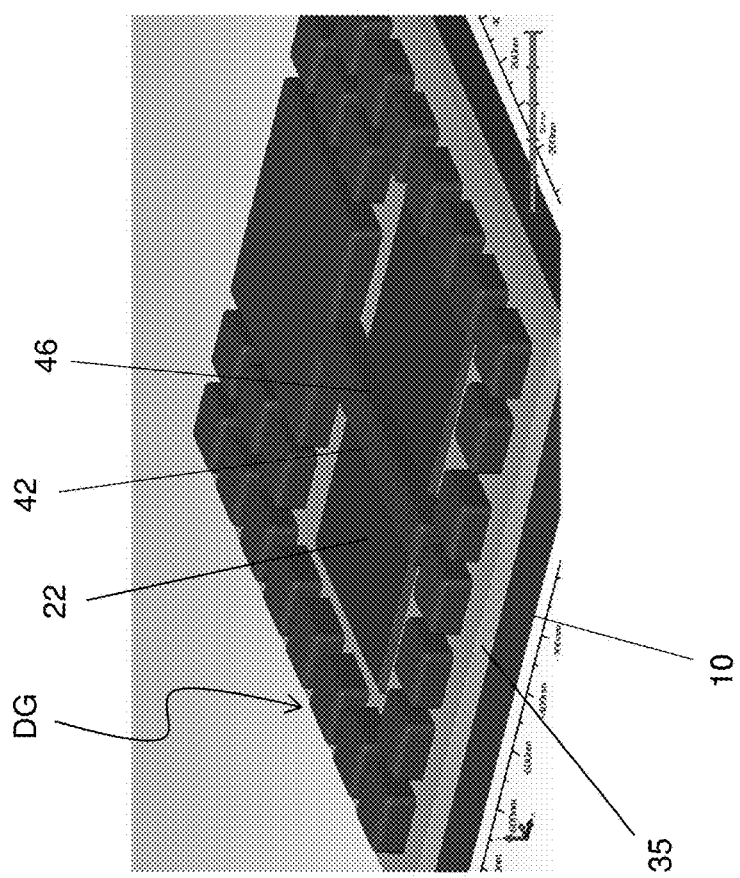

Subsequently, as shown in FIGS. 7A and 7B, first sidewall spacers 46 are formed on side faces of the dummy gate electrode 40. A blanket layer of an insulating material for first sidewall spacers is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structure. In some embodiments, the blanket layer is deposited to a thickness in a range from about 2 nm to about 30 nm. In one embodiment, the insulating material of the blanket layer is different from the materials of the dummy gate structure, and is made of a silicon nitride-based material, such as silicon nitride, SiON, SiOCN or SiCN and combinations thereof. In some embodiments, the blanket layer is made of silicon nitride. The sidewall spacers are formed on opposite side faces of the dummy gate structure, by anisotropic etching. As shown in FIGS. 7A and 7B, the sidewalls 46' are formed on side faces of the semiconductor layer 22, and sidewall spacers are also formed on dummy structures DG.

Figure 8B:
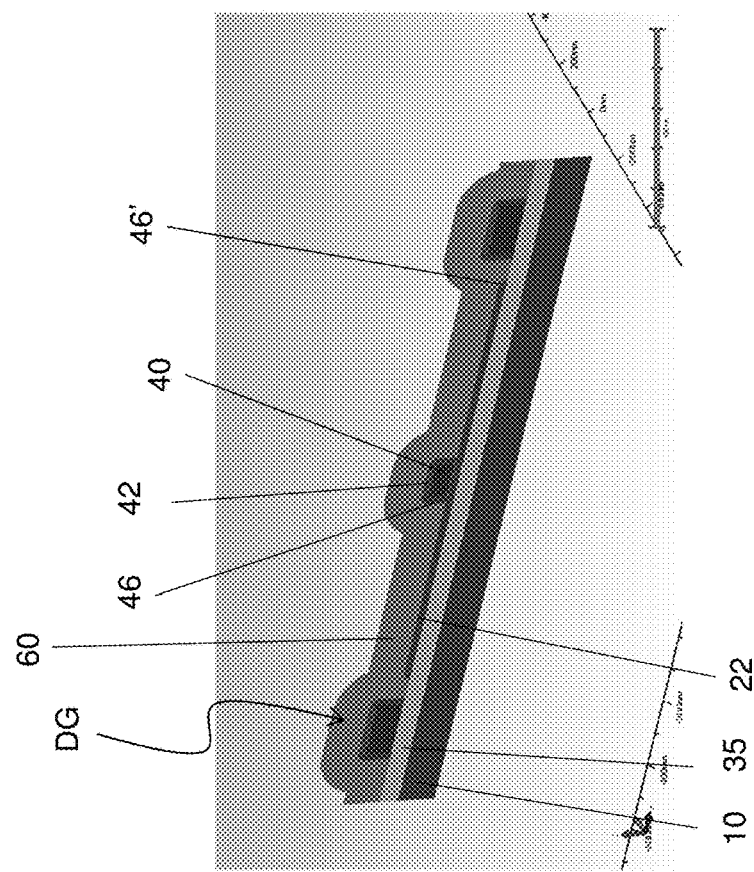
FIGS. 8A and 8B show one of the various stages of manufacturing a semiconductor FET device according to an embodiment of the present disclosure.
Figure 8A:
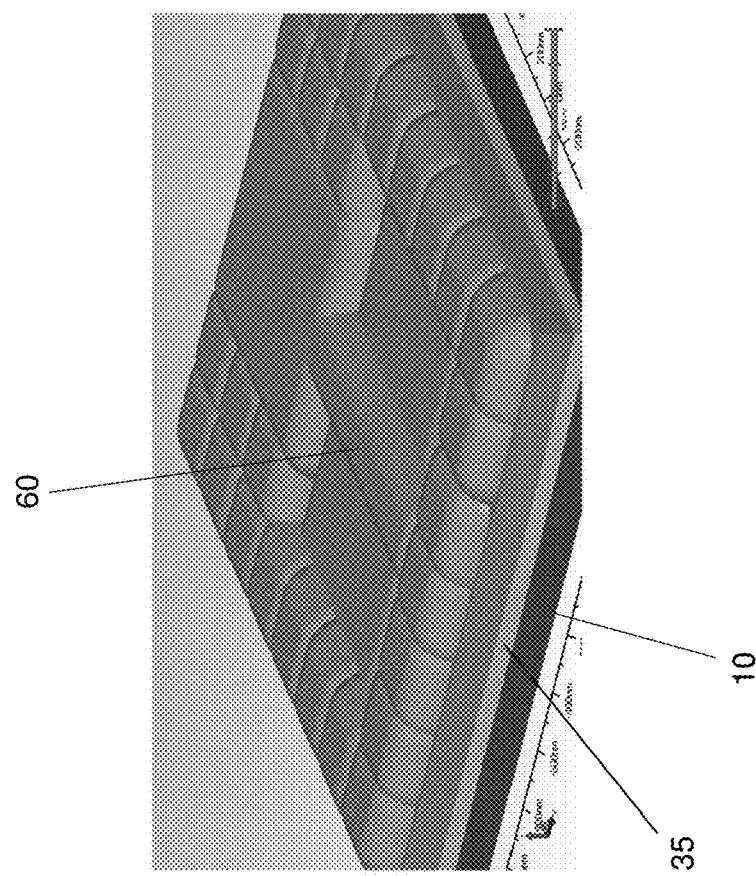

Then, as shown in FIGS. 8A and 8B, a source/drain epitaxial layer 60 is formed. The source/drain epitaxial layer 60 includes one or more layers of Si, SiP, SiC and SiCP for an n-channel FET or SiGe, Ge for a p-channel FET. For the P-channel FET, boron (B) may also be contained in the source/drain region. The source/drain epitaxial layer is formed by an epitaxial growth method using CVD, ALD or MBE, at a temperature less than 500° C. in some embodiments. In other embodiments, the temperature is in a range from about 250° C. to about 450° C., and in certain embodiments, is in a range from about 250° C. to about 350° C. In some embodiments, the source/drain epitaxial layer is non-selectively formed not only over the source/drain regions of the semiconductor layer 22 but also over the insulating layer 35. In some embodiments, before the source/drain epitaxial layer 60 is formed, the source/drain region of the semiconductor layer 22 is recessed, and the source/drain epitaxial layer 60 is formed over the recessed source/drain region. In some embodiments, the source/drain epitaxial layer 60 is formed such that a top of the source/drain epitaxial layer 60 is located above the dummy gate structure including the dummy gate electrode 40 and the hard mask layer 42. In other embodiments, the source/drain epitaxial layer 60 is formed such that the source/drain epitaxial layer 60 fully covers the dummy gate structure.

Figure 9B:
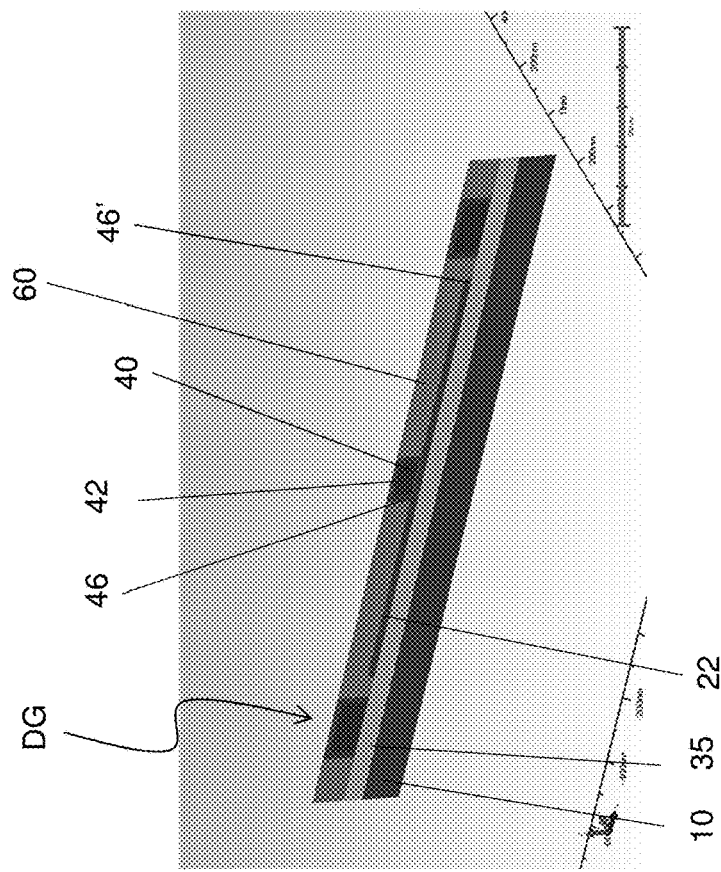
FIGS. 9A and 9B show one of the various stages of manufacturing a semiconductor FET device according to an embodiment of the present disclosure.
Figure 9A:
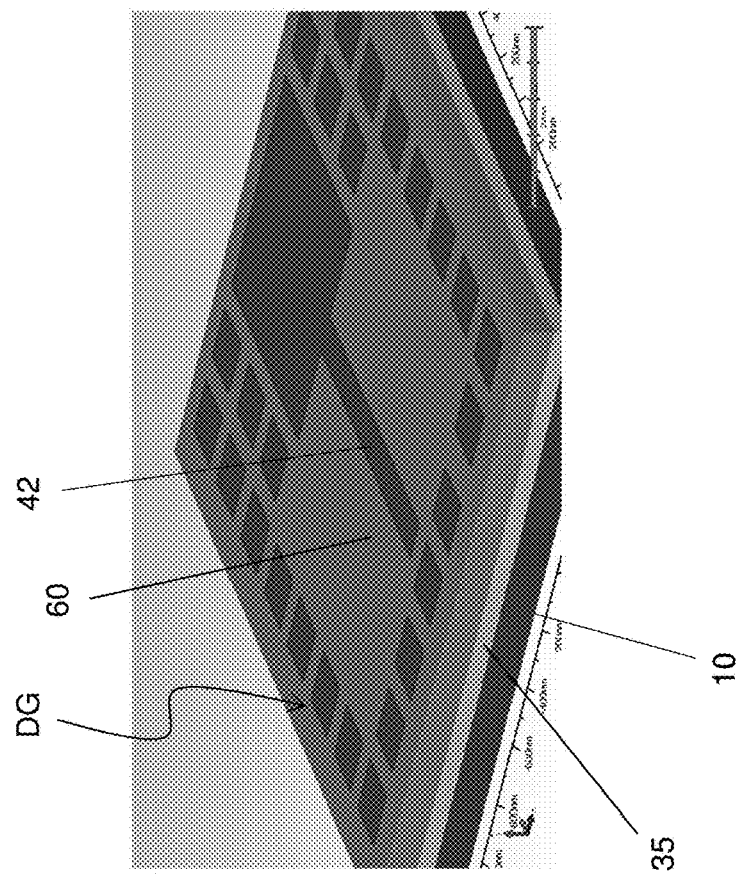

Then, as shown in FIGS. 9A and 9B, a planarization operation, such as chemical mechanical polishing (CMP) process, is performed to planarize the source/drain epitaxial layer 60. In some embodiments, the CMP process is performed such that the hard mask layer 42 is exposed.

Figure 10B:
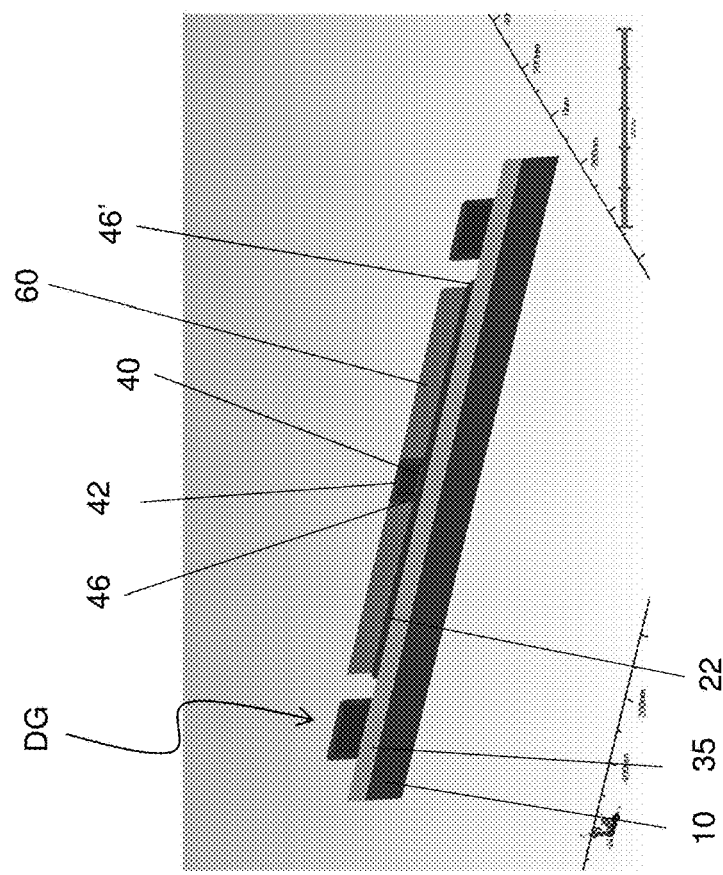
FIGS. 10A and 10B show one of the various stages of manufacturing a semiconductor FET device according to an embodiment of the present disclosure.
Figure 10A:
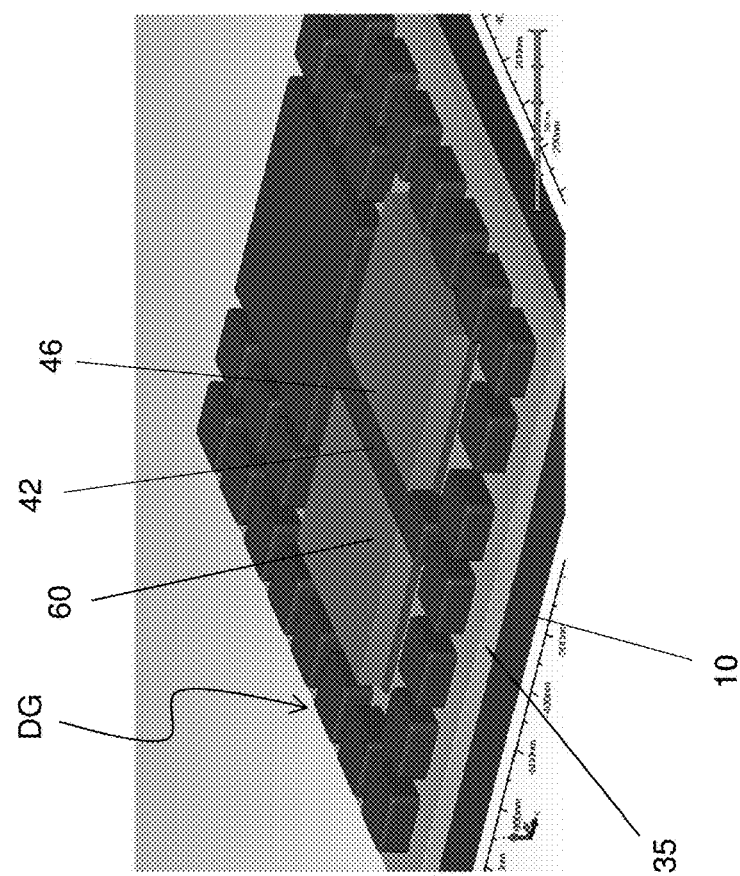

Subsequently, as shown in FIGS. 10A and 10B, by using one or more of lithography and etching operations, the planarized source/drain epitaxial layer 60 is patterned so that the source/drain epitaxial layer remains substantially over the source/drain regions of the semiconductor layer 20.

In some embodiments, the source/drain epitaxial layer 60 includes a crystalline portion formed over the source/drain region of the semiconductor layer 22 and a non-crystalline portion formed over the insulating layer 35. In some embodiments, the non-crystalline portion of the planarized source/drain epitaxial layer 60 may be selectively removed by suitable wet and/or dry etching without using a lithography operation (no mask (resist) pattern). In some embodiments, an ammonia hydroxide-hydrogen peroxide-water mixture (APM) is used as a wet etchant.

Figure 11B:
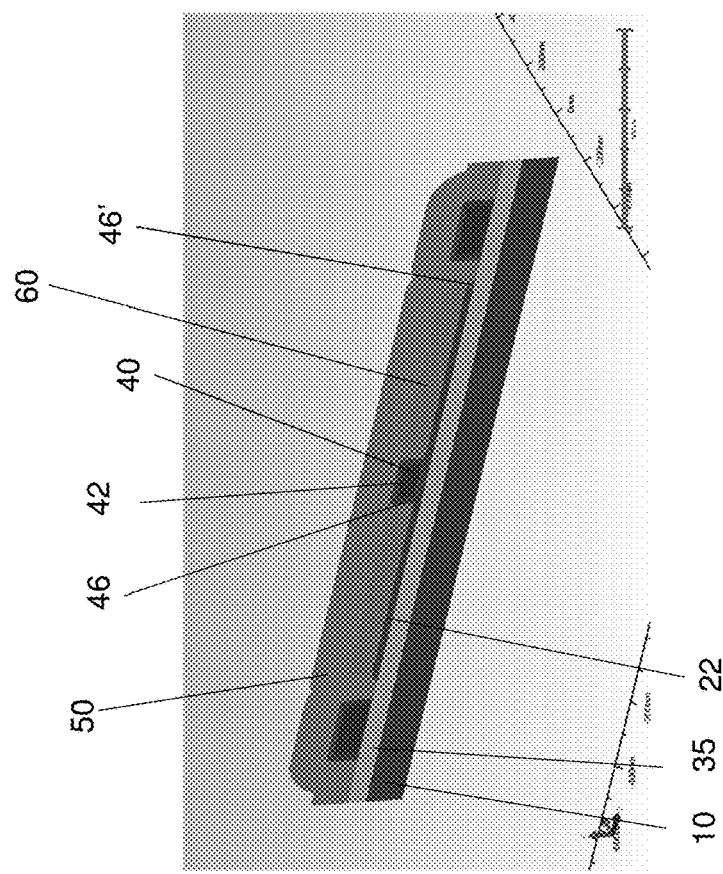
FIGS. 11A and 11B show one of the various stages of manufacturing a semiconductor FET device according to an embodiment of the present disclosure.
Figure 11A:
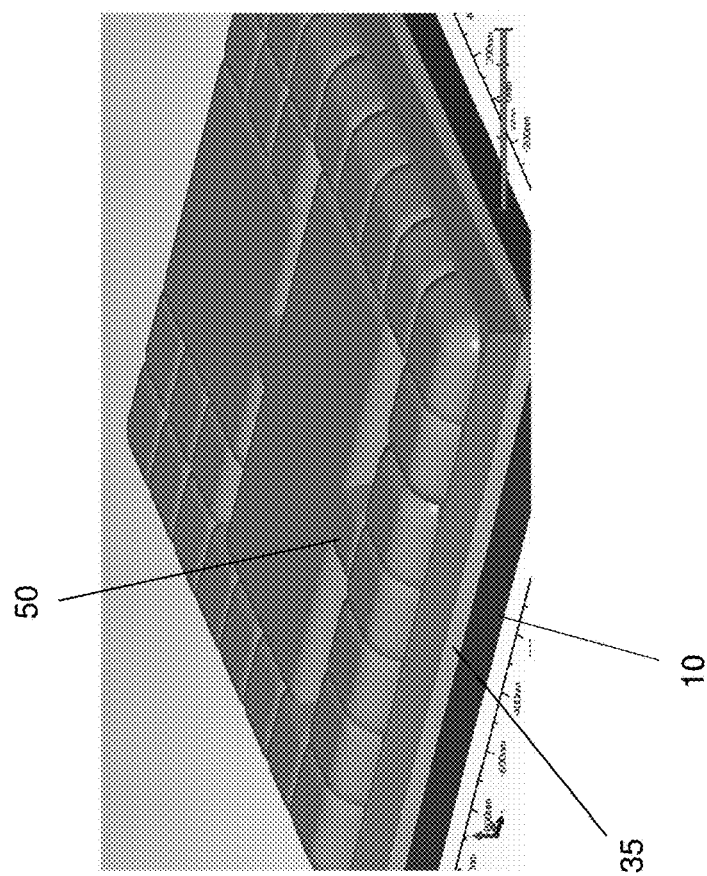
Figure 12B:
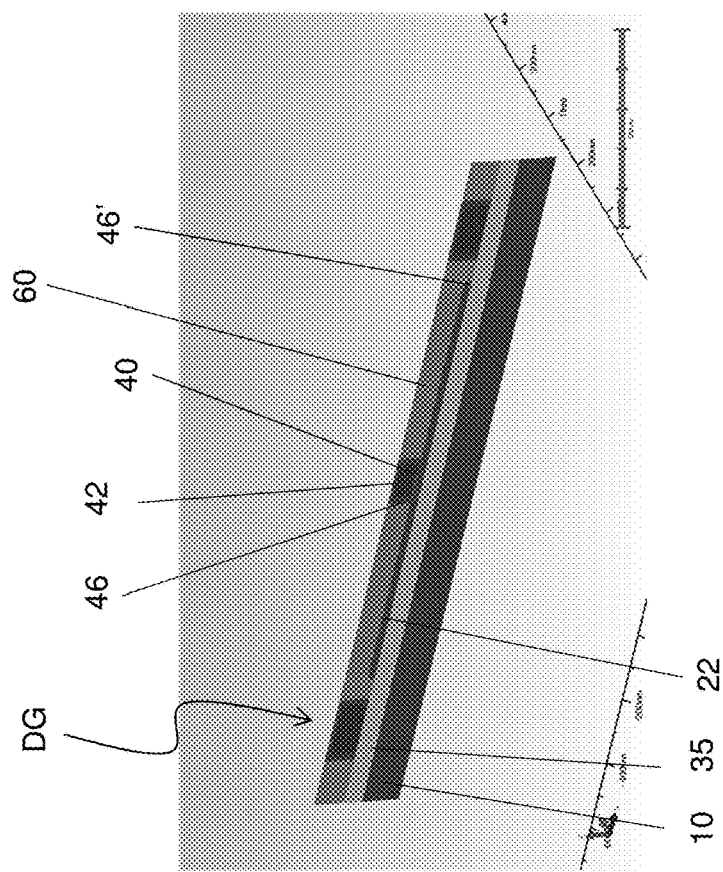
FIGS. 12A and 12B show one of the various stages of manufacturing a semiconductor FET device according to an embodiment of the present disclosure.
Figure 12A:
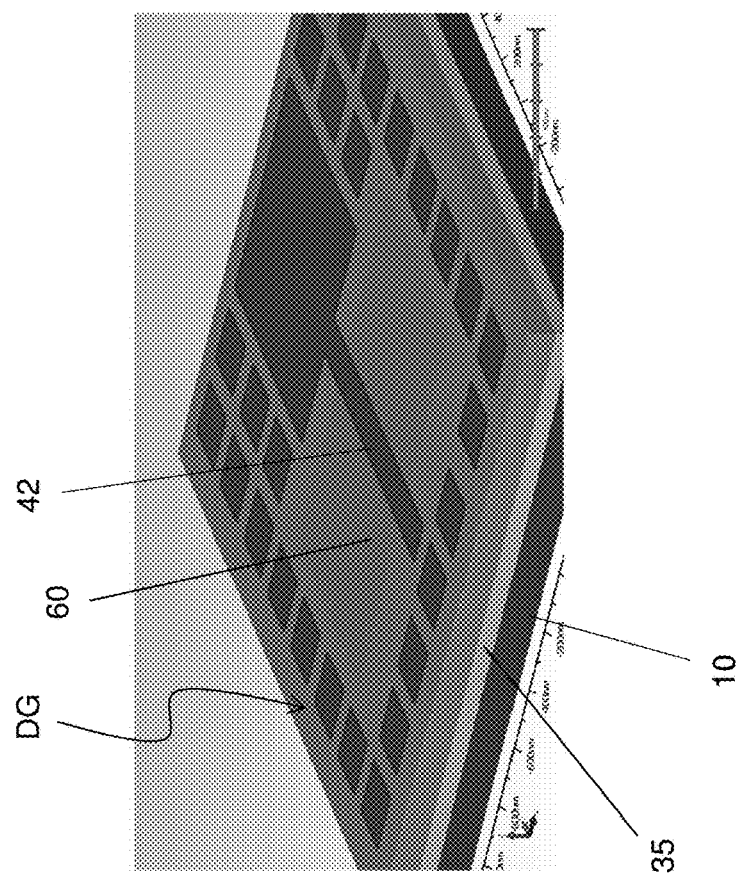

Then, a first interlayer dielectric (ILD) layer 50 is formed over the source/drain epitaxial layer 60 and the dummy gate structure, as shown in FIGS. 11A and 11B. The materials for the first ILD layer 50 include compounds comprising Si, O, C and/or H, such as silicon oxide, SiCOH and SiOC. Organic materials, such as polymers, may be used for the first ILD layer 50. After the first ILD layer 50 is formed, a planarization operation, such as CMP, is performed, so that the top portions of the source/drain epitaxial layer 60 and the dummy gate electrode layer 40 are exposed, as shown in FIGS. 12A and 12B. In some embodiments, the source/drain epitaxial layer 60 and/or the dummy gate electrode layer 40 functions as a CMP stop layer. In some embodiments, before the first ILD layer 50 is formed, a contact etch stop layer, such as a silicon nitride layer or a silicon oxynitride layer, is formed.

Figure 13A:
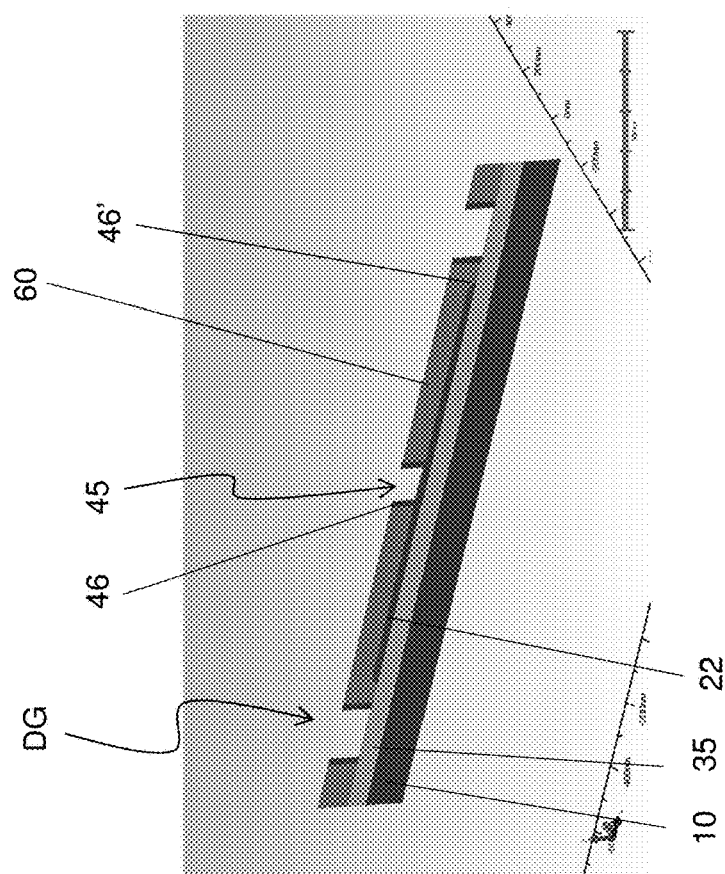
FIGS. 13A and 13B show one of the various stages of manufacturing a semiconductor FET device according to an embodiment of the present disclosure.
Figure 13B:
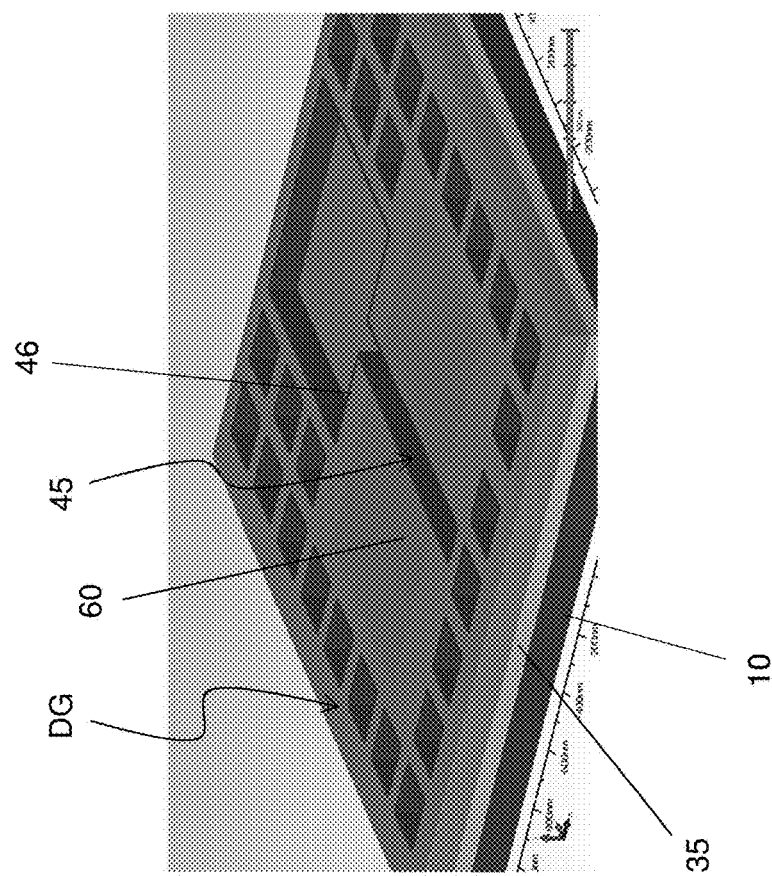

Then, the dummy gate electrode layer 40 and the dummy gate dielectric layer are removed, thereby forming a gate space 45, as shown in FIGS. 13A and 13B. The dummy gate structure can be removed using plasma dry etching and/or wet etching. In some embodiments, when the dummy gate electrode layer 40 is made of polycrystalline or amorphous Ge, an ammonia hydroxide-hydrogen peroxide-water mixture (APM) is used as a wet etchant. In some embodiments, when the dummy gate electrode layer 40 is made of polycrystalline or amorphous Si, a tetramethylammonium hydroxide solution (TMAH) is used as a wet etchant. The dummy gate dielectric layer is also removed by suitable wet/dry etching.

Figure 14B:
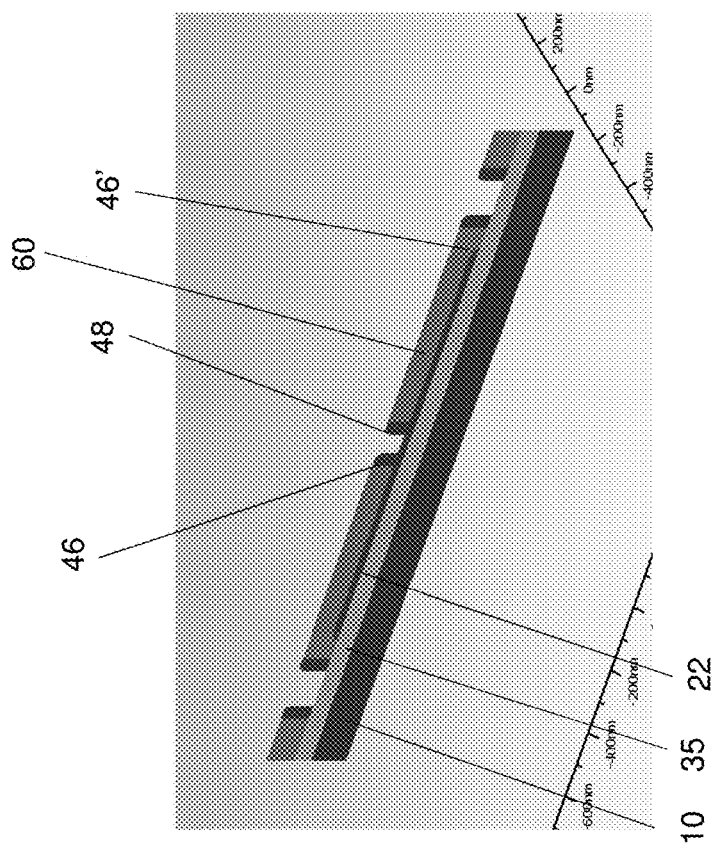
FIGS. 14A and 14B show one of the various stages of manufacturing a semiconductor FET device according to an embodiment of the present disclosure.
Figure 14A:
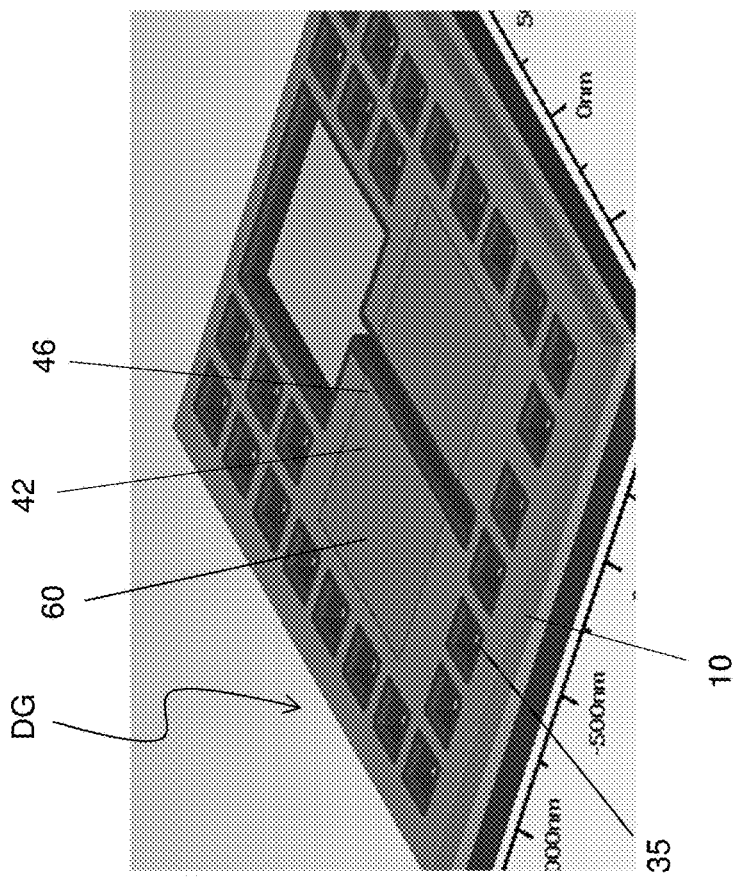

After the dummy gate structure is removed, in some embodiments, second gate sidewall spacers 40 are optionally formed on the first gate sidewall spacers 46 in the gate space 45, as shown in FIGS. 14A and 14B. The dielectric material for the second gate sidewall spacers 48 may be the same as or may be different from that of the first sidewall spacers 46. By forming the second gate sidewall spacers 48, the width of the gate space 45 is reduced, and a gate length of a metal gate electrode, which is subsequently formed, can be reduced.

Figure 15B:
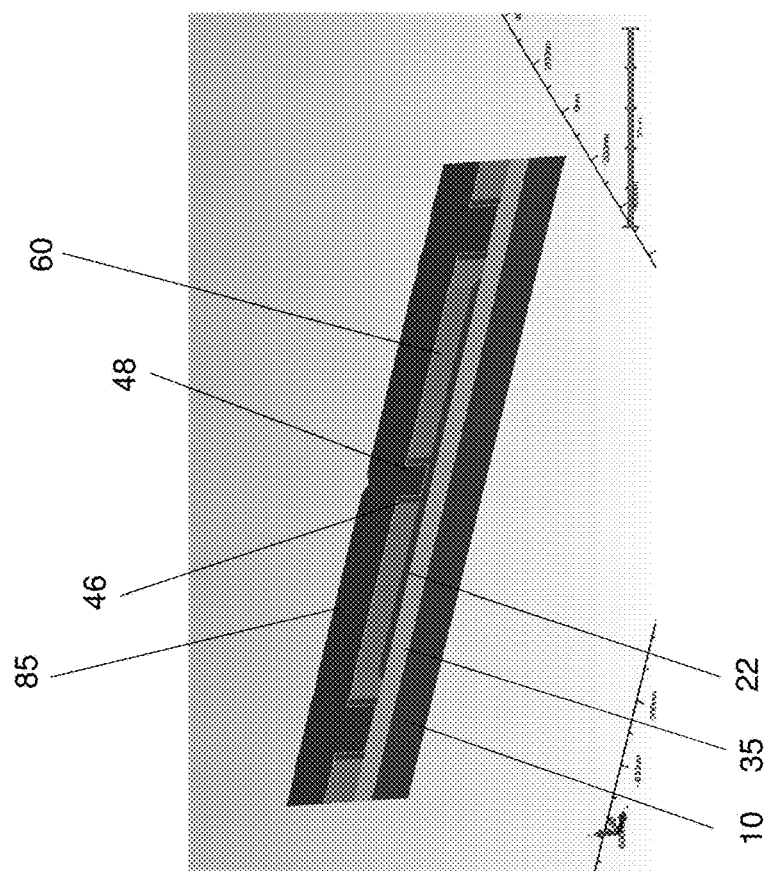
FIGS. 15A and 15B show one of the various stages of manufacturing a semiconductor FET device according to an embodiment of the present disclosure.
Figure 15A:
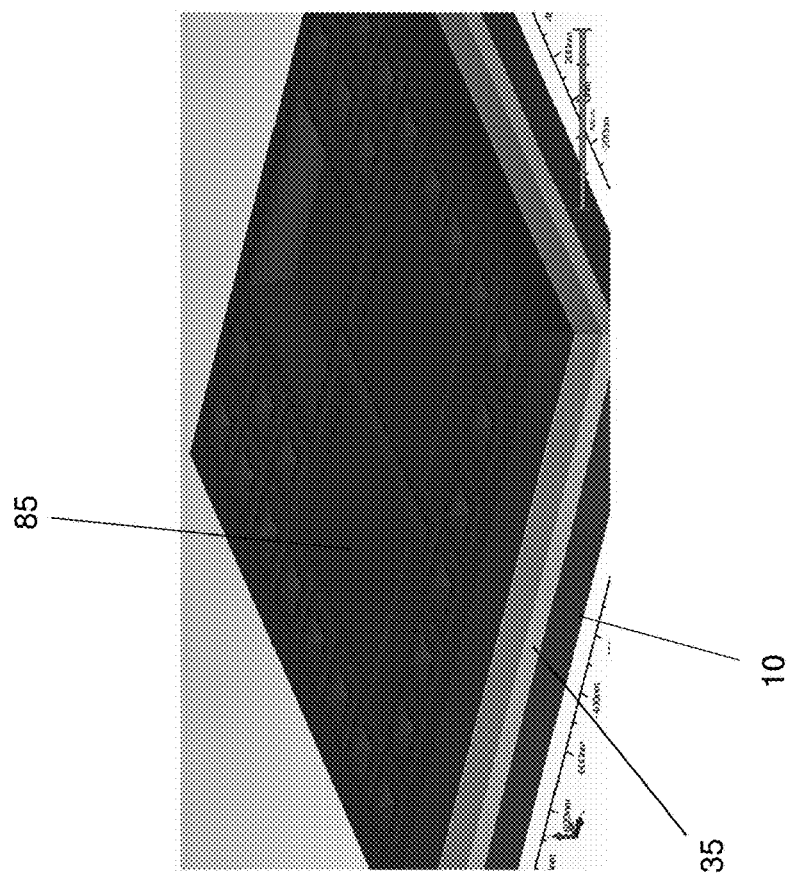

Then, as shown in FIGS. 15A and 15B, a gate dielectric layer and a gate electrode 85 are formed in the gate space. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layer and the dielectric material, by using chemical oxidation. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 10 nm in one embodiment.

Figure 16B:
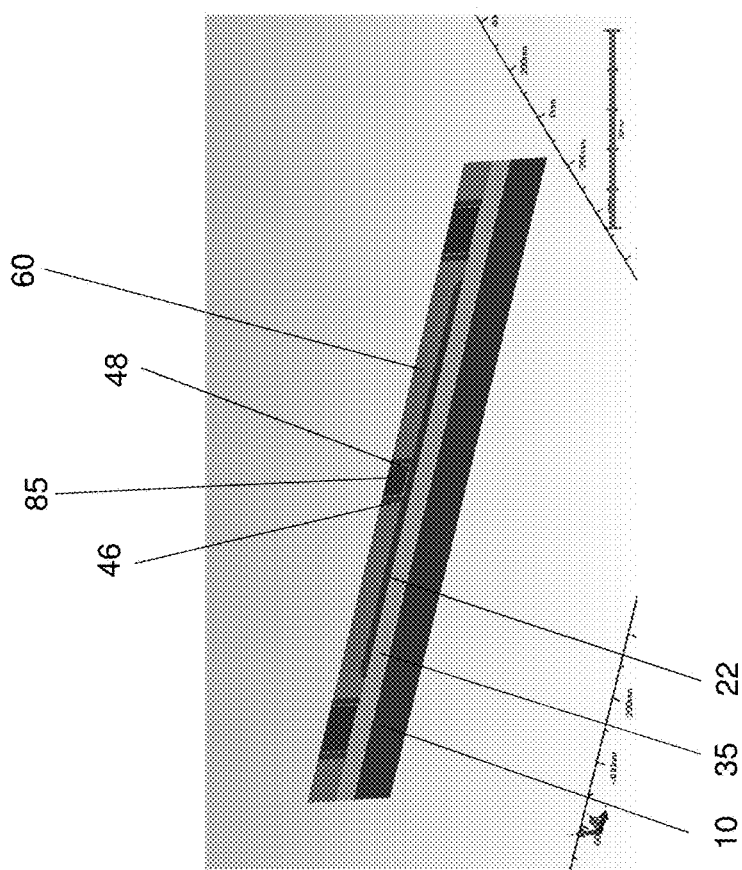
FIGS. 16A and 16B show one of the various stages of manufacturing a semiconductor FET device according to an embodiment of the present disclosure.
Figure 16A:
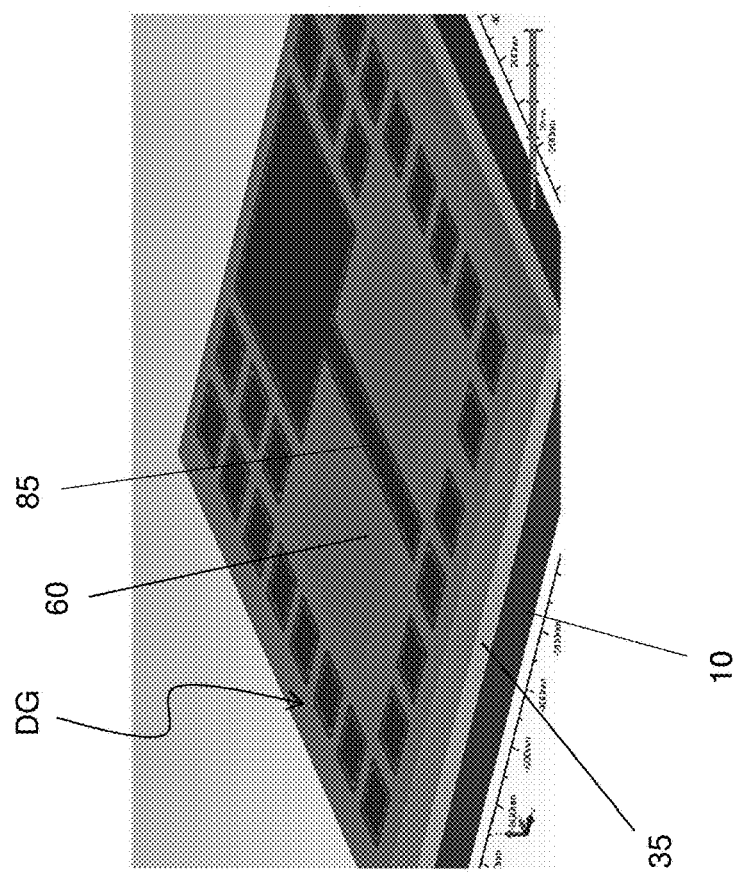

The gate electrode layer 82 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 85 may be formed by CVD, ALD, electro-plating, or other suitable method. The metals for the gate dielectric layer 82 and the gate electrode layer 85 are also deposited over the upper surface of the first ILD layer 50. The material for the gate electrode layer 85 formed over the first ILD layer 50 is then planarized by using, for example, CMP, until the top surface of the first ILD layer 50 is revealed, as shown in FIGS. 16A and 16B. In some embodiments, after the planarization operation, the metal gate electrode layer is recessed and a cap insulating layer (not shown) is formed over the recessed gate electrode layer. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 82 and the gate electrode layer 85. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Further, a second ILD layer 70 is formed over the first ILD layer 50 (see, FIGS. 1-3), and conductive contacts 80 passing through the second ILD layer 70 or the second and first ILD layers are formed to contact the gate electrode 85 and the source/drain epitaxial layers 60. Contact openings are formed in the first and/or the second ILD layers 50, 70. One or more layers of conductive materials are formed in and over the contact openings and then a planarization operation, such as a CMP operation, is performed to form conductive contacts 80. In some embodiments, the conductive contacts 80 include a liner layer and a body layer. The liner layer is a barrier layer and/or a glue (adhesion) layer.

In some embodiments, a Ti layer is formed on the source/drain epitaxial layer and a TiN or TaN layer is formed on the Ti layer, as the liner layer. The body layer includes one or more layers of Co, Ni, W, Ti, Ta, Cu and Al, or any other suitable material.

It is understood that the FET undergoes further CMOS processes to form various features such as contacts/vias, interconnect metal layers, dielectric layers, passivation layers, etc.

Figure 17:
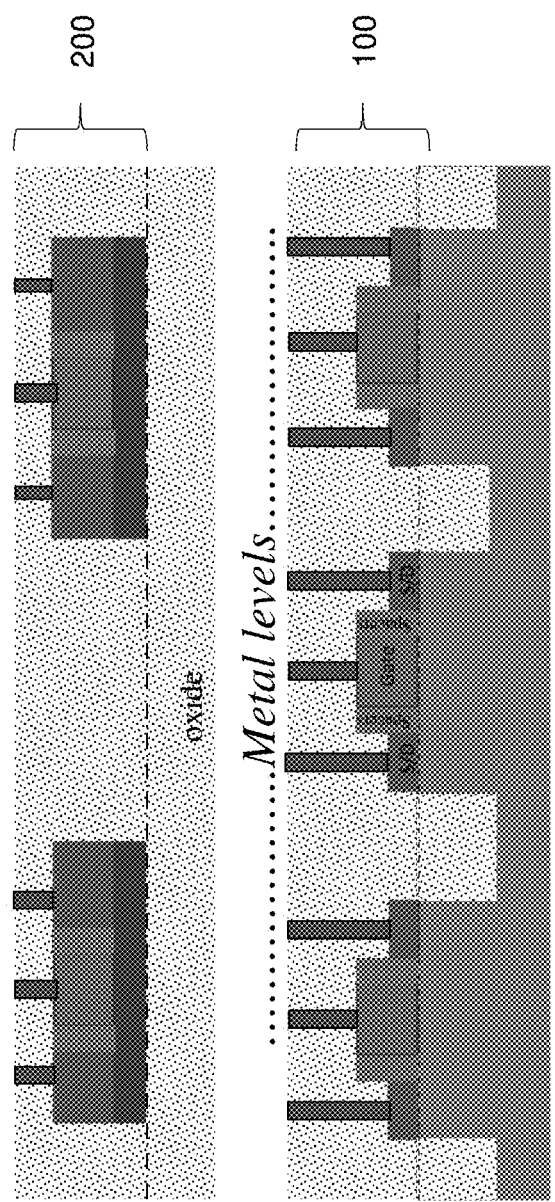
FIG. 17 shows a cross sectional view of a semiconductor FET device according to an embodiment of the present disclosure.

FIG. 17 shows a cross sectional view of a semiconductor device according to an embodiment of the present disclosure. As shown in FIG. 17, a lower layer device 100 is formed over a substrate. The lower layer devices 100 includes one or more fin field effect transistors (FinFETs), gate-all-around FET (GAA FET), planar FETs, vertical FETs or any other electronic devices. FIG. 17 also shows an upper layer device 200 disposed over the lower layer device 100. In some embodiments, one or more ILD layers, metal wiring layers and/or via contacts are disposed between the lower layer device 100 and the upper layer device 200. In some embodiments, the upper layer device 200 includes one or more FETs manufactured by the aforementioned embodiments of the present disclosure.

In the foregoing embodiments, it is possible to form a source/drain structure without increasing the number of lithography processes, or even to eliminate one lithography process in a gate replacement process. It is also possible to reduce a gate length in the gate replacement process. Further, it is possible to obtain a large source/drain epitaxial layer, which can also increase a contact area. In addition, since a low temperature process is possible to form a source/drain epitaxial layer, the foregoing processes can be useful for a back-end-of line process.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a dummy gate structure is formed over a channel region of a semiconductor layer, a source/drain epitaxial layer is formed, a planarization operation is performed on the source/drain epitaxial layer, the planarized source/drain epitaxial layer is patterned, the dummy gate structure is removed to form a gate space, and a metal gate structure is formed in the gate space. In one or more of the foregoing or following embodiments, first gate sidewall spacers are formed on opposite side faces of the dummy gate structure before the source/drain epitaxial layer is formed. In one or more of the foregoing or following embodiments, second gate sidewall spacers are formed on the first gate sidewall spacers in the gate space. In one or more of the foregoing or following embodiments, the dummy gate structure includes a dummy gate electrode layer made of poly crystalline or amorphous SiGe or Ge. In one or more of the foregoing or following embodiments, the source/drain epitaxial layer is formed such that a top of the source/drain epitaxial layer is located above the dummy gate structure. In one or more of the foregoing or following embodiments, the source/drain epitaxial layer is formed such that the source/drain epitaxial layer fully covers the dummy gate structure. In one or more of the foregoing or following embodiments, the source/drain epitaxial layer is formed at a temperature from 250° C. to 450° C. In one or more of the foregoing or following embodiments, a first interlayer dielectric (ILD) layer is formed over the planarized source/drain epitaxial layer and the dummy gate structure, and a planarization operation is performed on the first ILD layer so that upper surfaces of the planarized source/drain epitaxial layer and the dummy gate structure are exposed. In one or more of the foregoing or following embodiments, a second ILD layer is formed over the metal gate structure, and a source/drain contact is formed. In one or more of the foregoing or following embodiments, the semiconductor device is formed over a silicon-on-insulator (SOI) substrate, and the semiconductor layer is a silicon layer of the SOI substrate.

In accordance with one aspect of the present disclosure, in a method of manufacturing a semiconductor device, a semiconductor layer is formed on a dielectric layer disposed over a substrate, a dummy gate structure is formed over a channel region of a semiconductor layer, a source/drain epitaxial layer is formed, a planarization operation is performed on the source/drain epitaxial layer, the planarized source/drain epitaxial layer is patterned, the dummy gate structure is removed to form a gate space, and a metal gate structure is formed in the gate space. In one or more of the foregoing or following embodiments, first gate sidewall spacers are formed on opposite side faces of the dummy gate structure before the source/drain epitaxial layer is formed. In one or more of the foregoing or following embodiments, second gate sidewall spacers are formed on the first gate sidewall spacers in the gate space. In one or more of the foregoing or following embodiments, the dummy gate structure includes a dummy gate electrode layer made of poly crystalline or amorphous SiGe or Ge. In one or more of the foregoing or following embodiments, the source/drain epitaxial layer is formed such that a top of the source/drain epitaxial layer is located above the dummy gate structure. In one or more of the foregoing or following embodiments, the source/drain epitaxial layer is formed such that the source/drain epitaxial layer fully covers the dummy gate structure. In one or more of the foregoing or following embodiments, the source/drain epitaxial layer is formed at a temperature from 250° C. to 450° C. In one or more of the foregoing or following embodiments, a first interlayer dielectric (ILD) layer is formed over the planarized source/drain epitaxial layer and the dummy gate structure, and a planarization operation is performed on the first ILD layer so that upper surfaces of the planarized source/drain epitaxial layer and the dummy gate structure are exposed. In one or more of the foregoing or following embodiments, a field effect transistor (FET) is formed over the substrate, and the dielectric layer is formed to cover the FET.

In accordance with one aspect of the present disclosure, in a method of manufacturing a semiconductor device, a dummy gate structure is formed over a channel region of a semiconductor layer, and a source/drain epitaxial layer is formed. The source/drain epitaxial layer includes a crystalline portion formed over a source/drain region of the semiconductor layer and a non-crystalline portion formed over a dielectric layer. A planarization operation on the source/drain epitaxial layer, the non-crystalline portion of the planarized source/drain epitaxial layer is selectively removed, the dummy gate structure is removed to form a gate space, and a metal gate structure is formed in the gate space. In one or more of the foregoing or following embodiments, the source/drain epitaxial layer includes SiP. In one or more of the foregoing or following embodiments, first gate sidewall spacers are formed on opposite side faces of the dummy gate structure, before the source/drain epitaxial layer is formed. In one or more of the foregoing or following embodiments, second gate sidewall spacers are formed on the first gate sidewall spacers in the gate space. In one or more of the foregoing or following embodiments, the dummy gate structure includes a dummy gate electrode layer made of poly crystalline or amorphous SiGe or Ge. In one or more of the foregoing or following embodiments, the source/drain epitaxial layer is formed such that a top of the source/drain epitaxial layer is located above the dummy gate structure. In one or more of the foregoing or following embodiments, the source/drain epitaxial layer is formed such that the source/drain epitaxial layer fully covers the dummy gate structure. In one or more of the foregoing or following embodiments, the source/drain epitaxial layer is formed at a temperature from 250° C. to 450° C. In one or more of the foregoing or following embodiments, a first interlayer dielectric (ILD) layer is formed over the planarized source/drain epitaxial layer and the dummy gate structure, and a planarization operation is performed on the first ILD layer so that upper surfaces of the planarized source/drain epitaxial layer and the dummy gate structure are exposed. In one or more of the foregoing or following embodiments, a field effect transistor (FET) is formed over the substrate, and the dielectric layer is formed to cover the FET. In one or more of the foregoing or following embodiments, before the source/drain epitaxial layer is formed, the source/drain region of the semiconductor layer is recessed.

In accordance with one aspect of the present disclosure, a semiconductor device includes a channel formed as a part of a semiconductor layer disposed on a dielectric layer, a gate dielectric layer disposed over the channel, a gate electrode layer disposed over the gate dielectric layer, gate sidewall spacers disposed on opposite side faces of the gate electrode layer, and a source and a drain, each including an epitaxial layer. A height difference between an upper most portion of the epitaxial layer and an uppermost portion of the gate electrode layer is less than 5 nm. In one or more of the foregoing or following embodiments, the height difference is zero. In one or more of the foregoing or following embodiments, the source/drain epitaxial layer is disposed laterally beyond a source/drain region of the semiconductor layer and is disposed on a dielectric layer. In one or more of the foregoing or following embodiments, the dielectric layer is an isolation insulating layer. In one or more of the foregoing or following embodiments, source/drain epitaxial layer includes one or more of SiP and SiCP. In one or more of the foregoing or following embodiments, a height difference between an upper most portion of the gate sidewall spacers and the uppermost portion of the epitaxial layer or the uppermost portion of the gate electrode layer is less than 5 nm. In one or more of the foregoing or following embodiments, the gate sidewall spacers includes first gate sidewall spacers and second gate sidewall spacers, and a curved surface of the first gate sidewall spacers is in contact with the source/drain epitaxial layer and curved surface of the second gate sidewall spacers is in contact with the gate dielectric layer. In one or more of the foregoing or following embodiments, one or more of dummy gate structures are disposed on the dielectric layer. In one or more of the foregoing or following embodiments, a height difference between an upper most portion of the one or more of dummy gate structures and the uppermost portion of the source/drain epitaxial layer or the uppermost portion of the gate electrode layer is less than 5 nm. In one or more of the foregoing or following embodiments, a field effect transistor is covered by the dielectric layer.

In accordance with one aspect of the present disclosure, a semiconductor device includes an electronic device disposed on a substrate, one or more dielectric layers disposed over the electronic device, and thin film transistors disposed on an uppermost layer of the one or more dielectric layers.

Each of the thin film transistor includes a channel formed as a part of a semiconductor layer disposed on a dielectric layer, a gate dielectric layer disposed over the channel, a gate electrode layer disposed over the gate dielectric layer, sidewall spacers disposed on opposite side faces of the gate electrode layer, and a source and a drain, each including an epitaxial layer. A ratio H1/H2 of a height of an upper most portion of the epitaxial layer to a height of an uppermost portion of the gate electrode layer measured from an upper surface of the semiconductor layer is in a range from about 0.90 to 1.10. In one or more of the foregoing or following embodiments, a height difference between the upper most portion of the epitaxial layer and the uppermost portion of the gate electrode layer is less than 5 nm. In one or more of the foregoing or following embodiments, the electronic device is a transistor. In one or more of the foregoing or following embodiments, the transistor is one of a fin field effect transistor and a gate-all-around transistor. In one or more of the foregoing or following embodiments, the height difference is zero. In one or more of the foregoing or following embodiments, the source/drain epitaxial layer is disposed laterally beyond a source/drain region of the semiconductor layer and is disposed on a dielectric layer. In one or more of the foregoing or following embodiments, the dielectric layer is an isolation insulating layer. In one or more of the foregoing or following embodiments, source/drain epitaxial layer includes one or more of SiP and SiCP. In one or more of the foregoing or following embodiments, a height difference between an upper most portion of the gate sidewall spacers and the uppermost portion of the epitaxial layer or the uppermost portion of the gate electrode layer is less than 5 nm. In one or more of the foregoing or following embodiments, the gate sidewall spacers includes first gate sidewall spacers and second gate sidewall spacers, and a curved surface of the first gate sidewall spacers is in contact with the source/drain epitaxial layer and curved surface of the second gate sidewall spacers is in contact with the gate dielectric layer. In one or more of the foregoing or following embodiments, one or more of dummy gate structures are disposed on the dielectric layer. In one or more of the foregoing or following embodiments, a height difference between an upper most portion of the one or more of dummy gate structures and the uppermost portion of the source/drain epitaxial layer or the uppermost portion of the gate electrode layer is less than 5 nm.

In accordance with one aspect of the present disclosure, a semiconductor device includes a channel made of a semiconductor material, a gate dielectric layer disposed over the channel, a gate electrode layer disposed over the gate dielectric layer, gate sidewall spacers disposed on opposite side faces of the gate electrode layer, and a source and a drain, each including an epitaxial layer. A height difference between an upper most portion of the epitaxial layer and an uppermost portion of the gate electrode layer is less than 5 nm. In one or more of the foregoing or following embodiments, the height difference is zero. In one or more of the foregoing or following embodiments, wherein the source/drain epitaxial layer is disposed laterally beyond a source/drain region of the semiconductor layer and is disposed on a dielectric layer. In one or more of the foregoing or following embodiments, the dielectric layer is an isolation insulating layer (STI). In one or more of the foregoing or following embodiments, source/drain epitaxial layer includes one or more of SiP and SiCP. In one or more of the foregoing or following embodiments, a height difference between an upper most portion of the gate sidewall spacers and the uppermost portion of the epitaxial layer or the uppermost portion of the gate electrode layer is less than 5 nm. In one or more of the foregoing or following embodiments, the gate sidewall spacers includes first gate sidewall spacers and second gate sidewall spacers, and a curved surface of the first gate sidewall spacers is in contact with the source/drain epitaxial layer and curved surface of the second gate sidewall spacers is in contact with the gate dielectric layer. In one or more of the foregoing or following embodiments, one or more of dummy gate structures are disposed on the dielectric layer. In one or more of the foregoing or following embodiments, a height difference between an upper most portion of the one or more of dummy gate structures and the uppermost portion of the source/drain epitaxial layer or the uppermost portion of the gate electrode layer is less than 5 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a dummy gate structure over a channel region of a semiconductor layer;
    forming a source/drain epitaxial layer on opposing sides of the dummy gate structure;
    performing a planarization operation on the source/drain epitaxial layer;
    patterning the planarized source/drain epitaxial layer;
    removing the dummy gate structure to form a gate space; and
    forming a metal gate structure in the gate space,
    wherein the source/drain epitaxial layer is formed such that a top of the source/drain epitaxial layer is located above the dummy gate structure.

2. The method of claim 1, further comprising forming first gate sidewall spacers on opposite side faces of the dummy gate structure before the source/drain epitaxial layer is formed.

3. The method of claim 2, further comprising, after the gate space is formed, forming second gate sidewall spacers on the first gate sidewall spacers in the gate space.

4. The method of claim 3, wherein the dummy gate structure includes a dummy gate electrode layer made of poly crystalline or amorphous SiGe or Ge.

5. The method of claim 1, wherein the source/drain epitaxial layer is formed such that the source/drain epitaxial layer fully covers the dummy gate structure.

6. The method of claim 1, wherein the source/drain epitaxial layer is formed at a temperature from 250° C. to 450° C.

7. The method of claim 1, further comprising:
    forming a first interlayer dielectric (ILD) layer over the planarized source/drain epitaxial layer and the dummy gate structure; and performing a planarization operation on the first ILD layer so that upper surfaces of the planarized source/drain epitaxial layer and the dummy gate structure are exposed.

8. The method of claim 7, further comprising:
forming a second ILD layer over the metal gate structure; and
forming a source/drain contact.

9. The method of claim 1, wherein:
the semiconductor device is formed over a silicon-on-insulator (SOI) substrate, and
the semiconductor layer is a silicon layer of the SOI substrate.

10. A method of manufacturing a semiconductor device, the method comprising:
forming a semiconductor layer on a dielectric layer disposed over a substrate;
forming a dummy gate structure over a channel region of the semiconductor layer;
forming a source/drain epitaxial layer on opposing sides of the dummy gate structure;
performing a planarization operation on the source/drain epitaxial layer;
patterning the planarized source/drain epitaxial layer;
removing the dummy gate structure to form a gate space; and
forming a metal gate structure in the gate space, wherein:
a part of the source/drain epitaxial layer is formed on and in direct contact with the dielectric layer, and
by the patterning the planarized source/drain epitaxial layer, a part of the source/drain epitaxial layer formed over the dielectric layer is removed.

11. The method of claim 10, further comprising forming first gate sidewall spacers on opposite side faces of the dummy gate structure before the source/drain epitaxial layer is formed.

12. The method of claim 11, further comprising forming second gate sidewall spacers on the first gate sidewall spacers in the gate space.

13. The method of claim 12, wherein the dummy gate structure includes a dummy gate electrode layer made of poly crystalline or amorphous SiGe or Ge.

14. The method of claim 10, wherein the source/drain epitaxial layer is formed such that a top of the source/drain epitaxial layer is located above the dummy gate structure.

15. The method of claim 14, wherein the source/drain epitaxial layer is formed such that the source/drain epitaxial layer fully covers the dummy gate structure.

16. The method of claim 10, wherein the source/drain epitaxial layer is formed at a temperature from 250° C. to 450° C.

17. The method of claim 10, further comprising:
forming a first interlayer dielectric (ILD) layer over the planarized source/drain epitaxial layer and the dummy gate structure; and
performing a planarization operation on the first ILD layer so that upper surfaces of the planarized source/drain epitaxial layer and the dummy gate structure are exposed.

18. The method of claim 17, comprising:
forming a field effect transistor (FET) over the substrate; and
forming the dielectric layer to cover the FET.

19. A method of manufacturing a semiconductor device, the method comprising:
forming a dummy gate structure over a channel region of a semiconductor layer;
forming a source/drain epitaxial layer, wherein the source/drain epitaxial layer includes a crystalline portion formed over a source/drain region of the semiconductor layer and a non-crystalline portion formed over a dielectric layer;
performing a planarization operation on the source/drain epitaxial layer;
selectively removing the non-crystalline portion of the planarized source/drain epitaxial layer;
removing the dummy gate structure to form a gate space; and
forming a metal gate structure in the gate space.

20. The method of claim 19, wherein the planarization operation is performed on an uneven upper surface of the source/drain epitaxial layer.

* * * * *